United States Patent [19]

Wehrli

[11] Patent Number: 4,532,473
[45] Date of Patent: Jul. 30, 1985

[54] NMR METHOD FOR MEASURING AND IMAGING FLUID FLOW

[75] Inventor: Felix W. Wehrli, Shorewood, Wis.

[73] Assignee: General Electric Company, Milwaukee, Wis.

[21] Appl. No.: 495,556

[22] Filed: May 18, 1983

[51] Int. Cl.³ ............................................ G01R 33/08
[52] U.S. Cl. ...................................... 324/306; 324/309
[58] Field of Search ......................... 324/306, 307, 309

[56] References Cited

U.S. PATENT DOCUMENTS

| 4,110,680 | 8/1978 | Bergman et al. | 324/0.5 B |
| 4,115,730 | 9/1978 | Mansfield | 324/309 |
| 4,297,637 | 10/1981 | Crooks et al. | 324/309 |
| 4,318,043 | 3/1982 | Crooks | 324/309 |

FOREIGN PATENT DOCUMENTS

| 2501794 | 7/1976 | Fed. Rep. of Germany . |
| 2928551 | 1/1980 | Fed. Rep. of Germany . |
| 3130006 | 2/1983 | Fed. Rep. of Germany . |

Primary Examiner—Michael J. Tokar
Assistant Examiner—Robert R. Raevis
Attorney, Agent, or Firm—Alexander M. Gerasimow; Douglas E. Stoner

[57] ABSTRACT

A method for measuring (direction and magnitude) and imaging fluid flow in an NMR sample. Nuclei in an imaging slice, transaxial, for example, to a direction of fluid flow, are first tagged (saturated or inverted) and then excited to produce a first NMR signal. This signal originates from tagged nuclei in the imaging slice and untagged nuclei which have partially or wholly replaced nuclei flowing out of the slice. Thereafter, nuclei are tagged in a second thicker sample region which includes the imaging slice and extends therefrom in a direction opposite to the fluid flow. The nuclei are again excited in the imaging slice. The NMR signal detected is again from the entire imaging slice but is due entirely to tagged nuclei (if the second slice is selected to have the appropriate thickness) and, therefore, has a smaller magnitude than the first signal. These signals are useful in measuring the fluid flow velocity. The method is also useful, for example, with multiple-angle projection reconstruction and two-dimensional Fourier transform (2DFT) techniques to reconstruct NMR images exhibiting flowing nuclei only.

32 Claims, 7 Drawing Figures

NMR METHOD FOR MEASURING AND IMAGING FLUID FLOW

BACKGROUND OF THE INVENTION

This invention relates to methods utilizing nuclear magnetic resonance (NMR) techniques for measuring and imaging a flowing fluid. The invention has particular applicability, but is not limited, to the measurement of blood flow in medical diagnostic studies.

By way of background, the nuclear magnetic resonance phenomenon occurs in atomic nuclei having an odd number of protons or neutrons. Due to the spin of the protons and the neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the magnetic moments precess about the axis of the field at a frequency which is dependent on the strength of the applied magnetic field and on the characteristics of the nuclei. The angular precession frequency, $\omega$, also referred to as the Larmor frequency, is given by the equation $\omega = \gamma B$, in which $\gamma$ is the gyromagnetic ratio which is constant for each NMR isotope and wherein B is the magnetic field acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillating at the Larmor frequency. Typically, such magnetic fields designated $B_1$ are applied orthogonal to the direction of the static magnetic field by means of a radio frequency (RF) pulse through coils connected to a radio-frequency-transmitting apparatus. The effect of field $B_1$ is to rotate magnetization M about the direction of the $B_1$ field. This may be best visualized if the motion of magnetization M due to the application of RF pulses is considered in a Cartesian coordinate system which rotates at a frequency substantially equal to the resonant frequency $\omega$ about the main magnetic field $B_o$ in the same direction in which the magnetization M precesses. In this case, the $B_o$ field is chosen to be directed in the positive direction of the Z-axis, which, in the rotating Cartesian system, is designated Z' to distinguish it from the fixed-coordinate system. Similarly, the X- and Y-axes are designated X' and Y'. Bearing this in mind, the effect of an RF pulse, then, is to rotate magnetization M, for example, from its direction along the positive Z' axis toward the transverse plane defined by the X' and Y' axes. An RF pulse having either sufficient magnitude or duration to rotate magnetization M into the transverse plane (i.e., 90° from the direction of the $B_o$ field) is conveniently referred to as a 90° RF pulse. Similarly, for a rectangular pulse if either the magnitude or the duration of an RF pulse is selected to be twice that of a 90° pulse, magnetization M will change direction from the positive Z' axis to the negative Z' axis. This kind of an RF pulse is referred to as a 180° RF pulse, or for obvious reasons, as an inverting pulse. It should be noted that a 90° or a 180° RF pulse will rotate magnetization M through the corresponding number of degrees from any initial direction of magnetization M. It should be further noted that an NMR signal will only be observed if magnetization M has a net transverse component (perpendicular to $B_o$) in the transverse plane. A 90° RF pulse produces maximum net transverse magnetization in the transverse plane since all of magnetization M is in that plane, while a 180° RF pulse does not produce any transverse magnetization.

RF pulses may be selective or nonselective. Selective pulses are typically modulated to have a predetermined frequency content so as to excite nuclear spins situated in preselected regions of the sample having magnetic-field strengths as predicted by the Larmor equation. The selective pulses are applied in the presence of localizing magnetic-field gradients. Nonselective pulses generally affect all of the nuclear spins situated within the field of the RF pulse transmitter coil and are typically applied in the absence of localizing magnetic-field gradients.

There are two exponential time constants associated with longitudinal and transverse magnetizations. The time constants characterize the rate of return to equilibrium of these magnetization components following the application of perturbing RF pulses. The first time constant is referred to as the spin-lattice relaxation time ($T_1$) and is the constant for the longitudinal magnetization to return to its equilibrium value. Spin-spin relaxation time ($T_2$) is the constant for the transverse magnetization to return to its equilibrium value in a perfectly homogeneous field $B_o$. In fields having inhomogeneities, the time constant for transverse magnetization is governed by a constant denoted $T_2^*$, with $T_2^*$ being less than $T_2$. In some instances, it is desirable to rapidly dissipate transverse magnetization component by applying a magnetic field gradient, as will be described more fully hereinafter.

There remains to be considered the use of magnetic-field gradients to encode spatial information (used to reconstruct images, for example) into NMR signals. Typically, there such gradients are necessary:

$$G_x(t) = \partial B_o / \partial x,$$

$$G_y(t) = \partial B_o / \partial y, \text{ and}$$

$$G_z(t) = \partial B_o / \partial z.$$

The $G_x$, $G_y$, and $G_z$ gradients are constant throughout the imaging slice, but their magnitudes are typically time dependent. The magnetic fields associated with the gradients are denoted, respectively, $b_x$, $b_y$, and $b_z$, wherein $$b_x = G_x(t)x,$$

$$b_y = G_y(t)y,$$

$$b_z = G_z(t)z,$$

within the volume.

In the past, the NMR phenomenon has been utilized by structural chemists to study in vitro the molecular structure of organic molecules. More recently, NMR has been developed into an imaging modality utilized to obtain transaxial images of anatomical features of live human subjects, for example. Such images depicting nuclear-spin distribution (typically protons associated with water in tissue), spin lattice ($T_1$), and/or spin-spin ($T_2$) relaxation constants are of medical diagnostic value in determining the state of health of tissue in the region examined. NMR techniques have also been extended to in-vivo spectroscopy of such elements as phosphorus and carbon, for example, providing reseachers with the tools for the first time to study chemical processes in a living organism. Equally important is the use of NMR as a non-invasive modality to study the direction and velocity of blood flows. Blood flow studies typically rely on NMR signals produced by protons associated with water molecules contained in blood fluid. It is with the flow measurement application of NMR that the present invention is concerned.

It is, therefore, an object of the present invention to provide a method utilizing NMR to detect blood flow.

It is another object of the invention to provide a method to measure the velocity of blood flow.

It is still another object of the invention to provide a method to measure the direction and velocity of blood flow in NMR images.

It is a further object of the invention to provide a method to measure the direction and velocity of flowing blood and to display the position of blood flow in a transaxial NMR image which does not exhibit signals from stationary nuclei.

It is yet another object of the invention to provide a method of measuring the longitudinal relation time ($T_1$) of a localized fluid flow.

SUMMARY OF THE INVENTION

In accordance with the inventive non-invasive method employing NMR for measuring direction and magnitude of flow velocity, a sample is first positioned in a substantially homogeneous magnetic field. A plurality of nuclear spins in a first slice, which is preferably substantially perpendicular to the direction of fluid flow are tagged (saturated or inverted) and then excited to produce a first NMR signal. This signal is due to tagged nuclear spins within the slice, as well as to untagged spins flowing into the slice to replace at least some of the tagged spins flowing out of the slice. A second plurality of nuclear spins is then tagged in a region of the sample which includes the slice and which extends therefrom in a direction opposite to the direction of the fluid flow. The nuclear spins in the slice are again excited into producing a second NMR signal originating from tagged spins situated in the slice, as well as from tagged spins flowing from the region into the slice. The first and second NMR signals are then utilized to determine the magnitude of flow velocity through the slice.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

The method of the invention will be described first in general terms with reference to FIGS. 1A, 1B, 2, and 3. The detailed implementation with specific methods for localizing blood flow to an imaging slice of a sample undergoing examination will be described with additional reference to FIGS. 4–6.

Figure 1A:
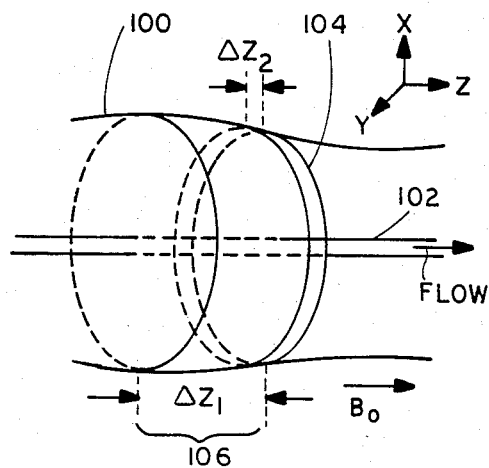
FIGS. 1A and 1B illustrate an NMR sample situated in a homogeneous magnetic field and having various sample slices defined therein by selective RF pulses for studying flow in accordance with the invention.
Figure 2:
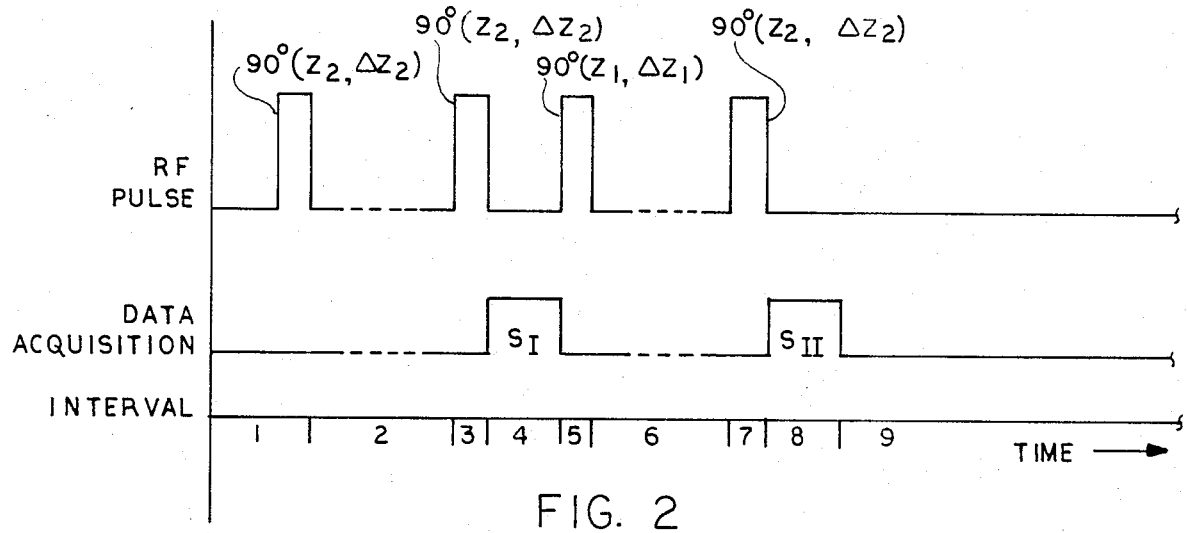
FIG. 2 depicts a generalized NMR pulse sequence used in selecting the sample slices depicted in FIG. 1 in accordance with the invention.
Figure 3:
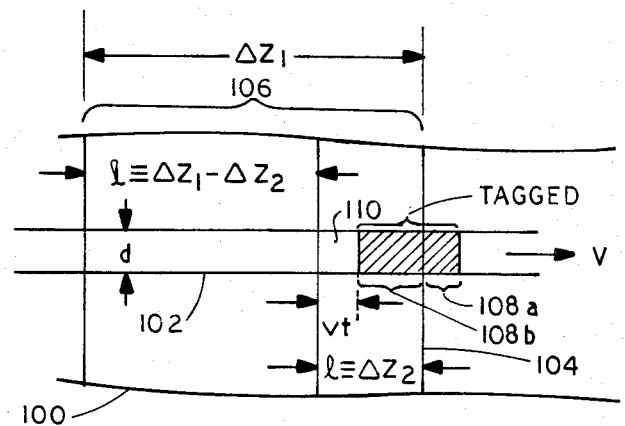
FIG. 3 dipicts schematically the selected sample slices utilized in the measurement of blood-flow direction and velocity in accordance with the invention.

FIG. 1A depicts a sample 100 situated in a substantially homogeneous magnetic field $B_o$ directed in the positive Z-axis direction of the Cartesian coordinate system, which is also the direction of blood flow within a vessel 102 in the sample. Referring now to FIGS. 1A, 2, and 3, nuclear spins in a first transverse slice 104 having a width $\Delta Z_2$ are perturbed by the application of a selective 90° RF pulse (as shown in interval 1 indicated along the horizontal axis in FIG. 2) and a dephasing magnetic field gradient (not shown), as will be more fully disclosed with reference to FIGS. 4–6. A selective 180° pulse (shown in FIG. 6) may be used in place of the 90° pulse to perturb magnetization M. The effect of the perturbation utilizing the 90° RF pulse is to saturate the nuclear spins contained in imaging slice 104 by destroying all transverse magnetization by dephasing the nuclear spins which comprise the net magnetization M rotated into the transverse plane by the 90° pulse. The effect of the 180° RF pulse would be to invert magnetization M from the positive Z-axis direction to the negative Z-axis direction so that, in this case, also, no net magnetization would exist in the transverse plane. Another method which may be used to destroy the transverse magnetization is described by Markley et al in *J. of Chem. Phys.*, Vol. 55, p. 3604 (1971). In accordance with this method, a train (e.g., 5–10 pulses) of short, randomly spaced selective 90° RF pulses are employed to saturate the nuclear spins. It should be noted that the sequence of a 90° RF pulse followed by a dephasing magnetic field gradient is preferred for use with the method of the invention. Hereinafter, nuclei which have been perturbed, as described above, will be referred to as the "tagged nuclei."

Following perturbation, the tagged nuclei are allowed to recover during interval 2 and begin to realign with the field $B_o$ to create a longitudinal magnetization component in a positive Z-axis direction whose magnitude depends on the length of interval 2. During the recovery period, the tagged nuclei indicated by shaded blocks 108a and 108b (FIG. 3), which were originally in imaging slice 104, are partially or fully replaced by unsaturated (untagged) nuclei as indicated by block 110. Thus, when a selective 90° detection pulse is applied in interval 3 of FIG. 2, the total net magnetization rotated by the detection pulse is the sum of the partially recovered longitudinal magnetization of tagged neclei remaining in slice 104 (shown in shaded block 108b) and the net longitudinal magnetization attributable to the untagged nuclei (block 110). The resulting NMR signal, $S_I$, is observed in data-acquisition interval 4 and represents a signal attributable to the tagged spins (stationary and flowing) located in imaging slice 104, as well as the untagged spins 110. Signal $S_I$, in this case, is more intense than it would be in the absence of flow, due to the transverse magnetization contributed by the untagged spins, as long as it is assumed that relaxation of the flowing nuclei during interval 2 is not complete.

The next step, in accordance with the invention, is to selectively tag nuclear spins situated in a slice 106 (FIG. 1A) having a width $\Delta Z_1$ (which is greater than width $\Delta Z_2$ of slice 104) by irradiating sample 100 in interval 5 with a selective 90° pulse having a frequency bandwidth greater than the frequency bandwidth of the 90° RF pulse applied in interval 1. In this case, the tagged nuclei will again flow out of the detection slice 104. However, they will be replaced by tagged nuclei from slice $\Delta Z_1$ which have been previously tagged by the application of the 90° saturation pulse in interval 5. Following a second recovery interval 6, which is equal in duration to interval 2, a second detection pulse, similar to the detection pulse applied in interval 1, is applied in interval 7, so as to rotate into the transverse plane the longitudinal magnetization component attributable to the recovery of the newly tagged nuclei. Therefore, as long as no untagged nuclei flow into the detection slice 104 during recovery period 6, that is, provided that $\Delta Z_1 - \Delta Z_2 > vt$ (FIG. 3) where v represents the average flow rate and t is the length of recovery period 6, the resulting signal observed in interval 8 will have the same strength as in the absence of flow. This signal is designated $S_{II}$ and, in general, has a magnitude which is smaller than the magnitude of signal $S_I$. The difference in the amplitudes of the two signals is attributable to the fact that signal $S_{II}$ is due entirely to tagged nuclear spins (stationary nuclear spins situated in imaging slice 104, as well as to tagged nuclei flowing in vessel 102). Thus, if signal $S_{II}$ is subtracted from signal $S_I$, there will be an exact cancellation of the signals arising from tagged nuclei. However, the magnitude of $S_I$ and $S_{II}$ for flowing nuclei, as indicated hereinabove, is different: i.e., $S_I$ is greater than $S_{II}$, hence, they do not cancel, provided that the flow direction is as indicated in FIG. 1 (in the positive Z-axis direction).

It will be also appreciated that the difference between signals $S_{II}$ and $S_I$ may be advantageously obtained by inverting the phase of one of the 90° detection pulses (as described hereinafter with reference to FIG. 6) occurring in either interval 3 or in interval 7. The effect of inverting the phase of the detection pulse is to also invert the phase of the corresponding NMR signal such that it is only necessary to add $S_I$ and $S_{II}$ signals to obtain the difference. An advantage associated with the use of phase-alternated detection pulses is that the signs of alternate signals $S_I$ or $S_{II}$ are inverted, and, further, phase inversion corrects for pulse imperfections, since any spurious signals attributable thereto will also be cancelled. The use of phase-inverted RF pulses to correct the effects of pulse imperfections is disclosed and claimed in application Ser. No. 394,071, filed July 1, 1982, now U.S. Pat. No. 4,443,760 and which is assigned to the same assignee as the present invention.

Figure 1B:
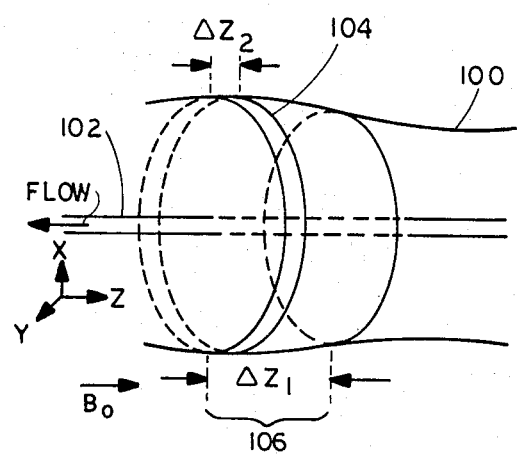

The NMR pulse sequence described with reference to FIG. 1A and FIG. 2 is suitable for detecting those spins flowing through slice 104 in the positive Z-axis direction, or at an angle of less than 90° relative to the positive Z-axis. Flow in the opposite direction will not be detected. In order to obtain flow measurements in the opposite direction, i.e., the negative Z-axis direction, or in a direction characterized by an angle of less than 90° relative to the negative Z-axis, the sequence depicted in FIG. 2 must be implemented with slice 106 of tagged nuclear spins being symmertrically disposed with respect to the imaging slice 104 as shown in FIG. 1B. This may be accomplished with a pulse sequence substantially as depicted in FIG. 2 with the exception that the 90° saturating pulse (or the 180° inverting pulse) applied in interval 5 is selected to have a frequency content such that nuclei situated to the right of imaging slice 104 in FIG. 1B are tagged. It should be noted that slice 106 in FIGS. 1A and 1B need not have a finite width $\Delta Z_1$. All that is necessary is that the width of slice 106 extend in a direction opposite to flow in vessel 102, such that only tagged nuclei flow into detection slice 104 during recovery period 6 and excition period 7, as described with reference to FIG. 1A and FIG. 3. A disadvangtage of this may be that an excessively long wait period (interval 9, FIG. 2) may be necessary to allow all tagged neclei to return to equilibrium before the pulse sequence (intervals 1–8) could be repeated. The waiting period may be maximally of the order of $T_1$ of the flowing nuclei.

The manner in which flow velocity is determined will now be described with reference to FIG. 3. The method will be described with reference to a pulse sequence of the type depicted in FIG. 2, in which it will be assumed that all of the RF pulses are of the 90° type. It will be further assumed in this example that the flow velocity profile within vessel 102 is rectangular. Rectangular flow velocity profile means that the velocity of blood flow along the vessel walls is substantially the same as through the center of the vessel. Using the notations indicated in FIG. 3, the relative strengths of two signals $S_I$ and $S_{II}$ may be expressed as $$S_I = \rho(l - vt)\pi(d^2/4)(1 - e^{-t/T_1}) + \rho vt\pi d^2/4 \quad (1)$$

$$S_{II} = \rho l \pi(d^2/4)(1 - e^{-t/T_1}) \quad (2)$$

wherein $\rho$ is nuclear spin density (number of nuclei per cubic centimeter of fluid)

l is defined as being the width of the imaging slice 104;

v is the velocity of flow in vessel 102;

d is the diameter of vessel 102;

$T_1$ is the spin-lattice relaxation time for the fluid flowing in vessel 102.

t is the time period between the mean application of the tagging and detection pulses.

The magnitude of the signal, S, attributable to the flowing untagged nuclei in block 110 (FIG. 3) may be obtained by subtracting signal $S_{II}$ Equation (2) from signal $S_I$ Equation (1) to yield $$S = \rho \pi(d^2/4)vt\ e^{-t/T_1} \quad (3)$$

The ratio of signal $S_I$ to $S_{II}$ is given by $$S_I/S_{II} = \frac{l(1 - e^{-t/T_1}) + vt\ e^{-t/T_1}}{l(1 - e^{-t/T_1})} \quad (4)$$

Hence, if $T_1$ of the flowing nuclei is known, the flow velocity can be computed from either Equation (3) or (4). Use of Equation (4) is preferred due to the fact that this case does not require knowledge of the quantity ρ, the nuclear spin density. The value of $T_1$ can be experimentally determined or reference data may be resorted to. The value of $T_1$ may be experimentally determined by any of the known methods such as saturation recovery and inversion recovery techniques. Detailed descriptions of the techniques for measurement of $T_1$ may be found in Shaw, D. *Fourier Transform NMR Spectroscopy*, Elsevier Scientific Publishing Company, New York (1976). It should be noted that the spin-lattice relaxation times are different in venous and arterial blood, due to the fact the oxygen (a paramagnetic agent) in arterial blood affects relaxation rate. Therefore, the appropriate value must be used depending on whether measurements are being taken of venous or arterial blood.

One method in accordance with the invention of calculating $T_1$ for flowing blood (arterial or venous) is to repeat the pulse sequence (intervals 1-8) of FIG. 2 selecting a different length interval, t or t', for recovery intervals 2 and 6 in each repetition. Each repetition, thus, yields difference signals S and S' for intervals t and t', respectively. $T_1$ may then be calculated from equation $$S/S' = \frac{te^{-t/T1}}{t'e^{-t'/T1}} \quad (5)$$

in which ratio S/S' is a function of recovery delays, t and t', and $T_1$. In practice, it is advantageous to take several measurements (e.g., 4–10) for intervals t and t' of varying lengths. In measuring $T_1$, intervals 2 and 6 in each sequence should be of equal duration (t or t') so that the spin relaxation is equal in each interval.

Figure 4:
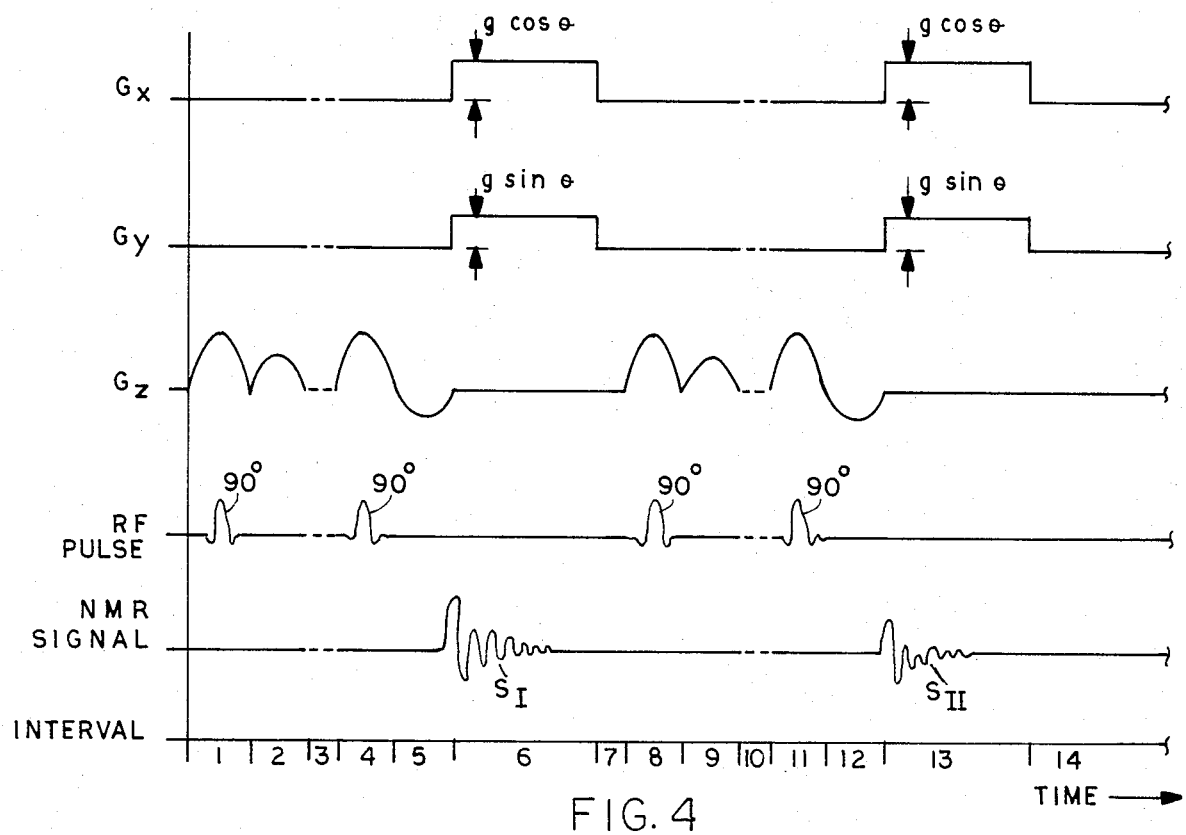
FIG. 4 illustrates a detailed NMR pulse sequence used to measure direction and velocity of blood flow in accordance with the invention utilizing the multiple-angle projection and reconstruction method.

The detailed manner in which the method of the invention may be utilized with the technique of multiple angle projection reconstruction to obtain images of an object depicting blood flow will now be undertaken with reference to FIGS. 1A and 4. It should be observed that, in each of FIGS. 4–6, sample 100 in FIG. 1A is assumed to be positioned in a homogeneous magnetic field $B_o$ and, therefore, field $B_o$ is not separately depicted in each of these figures.

In interval 1, shown along the horizontal axis of FIG. 4, sample 100 (FIG. 1A) is subjected to a magnetic field gradient $G_z$ and is simultaneously irradiated with a selective 90° RF pulse. The RF pulse is preferably modulated, as indicated schematically in FIG. 4, by a sinc (Sin x/x) function to contain a limited band of frequencies selected as predicted by the Larmor equation to rotate macroscopic magnetization M into the transverse plane in imaging slice 104 having a substantially rectangular profile. The RF pulse could be modulated by a Gaussian function. The excited slice, in this case, will have a Gaussian profile. Dephasing of the nuclear spins rotated into the transverse plane in interval 1 is achieved in interval 2 by the application of a second $G_z$ magnetic field gradient, such that at the end of interval 2 the net transverse magnetization in the transverse plane is rapidly destroyed. Hence, an NMR signal is not observed at this point. In interval 3, the longitudinal component of magnetization M is allowed to recover (the spins realign themselves with the $B_o$ magnetic field) in accordance with the spin-lattice relaxation time. In interval 4, a second 90° RF pulse, termed the detection pulse, is applied in the presence of a pulsed $G_z$ magnetic field gradient to rotate the recovered longitudinal magnetization component in detection slice 104 into the transverse plane. The direction of the $G_z$ magnetic field gradient is reversed and its magnitude halved in interval 5 to rephase nuclear spins rotated by the RF pulse applied in interval 4. A first NMR signal, previously identified as $S_I$, is observed in interval 6 in the presence of linear $G_x$ and $G_y$ magnetic field gradients. The NMR signal in interval 6 is due to both stationary and flowing (tagged and untagged) nuclei situated in that portion of vessel 102 falling within slice 104.

The $G_x$ and $G_y$ gradients are directed, respectively, in the X- and Y-axes directions and have magnitudes which vary in sinusoidal fashion in successive applications of the pulse sequence depicted in FIG. 4. The magnitudes of the $G_x$ and $G_y$ gradients are given by $G_x = g \cos\theta$, and $G_y = g \sin\theta$, in which θ is the angle of a single projection during interval 6 and g is a constant. The $G_x$ and $G_y$ gradients add vectorially to produce a resultant radial gradient in the imaging slice 104 at an angle θ. The NMR signal observed in interval 6 thus contains spatial information (projection) from the entire plane encoded in the direction of the radial gradient. In successive applications of the NMR pulse sequence depicted in FIG. 4, as is necessary in order to obtain sufficient information to image the entire slice 104, multiple projections are obtained by changing projection angle θ by an amount Δθ, for example, typically of the order of one degree, to collect spatial data from 180 projections in a 180° arc. For each new projection, the magnitudes of the $G_x$ and $G_y$ gradients are adjusted in accordance with the newly selected projection angle θ.

Following a short wait in interval 7 to allow currents to subside in the $G_x$ and $G_y$ gradient coils, a second 90° saturation pulse similar to the saturation pulse in interval 1 is applied in the presence of a $G_z$ gradient. In this case, the frequency content of the RF pulse is selected to be sufficiently wide to rotate magnetization M, due to nuclear spins situated in a wider saturation slice, such as slice 106 shown in FIG. 1A. As before, the saturation RF pulse and gradient are followed by a second $G_z$ gradient applied in interval 9 to dephase the nuclear spins in the transverse plane so as to destroy the net transverse magnetization. Following a second recovery period in interval 10 to allow the longitudinal magnetization component to reestablish itself along the direction of magnetic field $B_o$, a second selective 90° RF detection pulse, similar to that in interval 4, is again applied in the presence of a $G_z$ gradient. The direction of the $G_z$ gradient is again reversed in interval 12 to reestablish phase coherence of the nuclear spin situated in slice 104. A second signal, $S_{II}$, due primarily to tagged nuclei, is observed in interval 13 in the presence of gradients $G_x$ and $G_y$ which are substantially identical to the gradients applied in interval 6.

The pulse sequence comprising intervals 1 through 13 depicted in FIG. 4 is repeated to obtain a plurality of spaced projections each separated by angle Δθ so as to cover at least a 180° arc in imaging slice 104. The $S_I$ and $S_{II}$ signals are sampled for each projection, Fourier transformed and stored in an electronic memory of conventional NMR apparatus (not shown) for later use. Fourier transformation of the signals corresponding to each projection yields the spatial distribution of the NMR signal due to nuclei throughout the imaging slice 104. Separate images using $S_I$ and $S_{II}$ data are reconstructed from all of the spatial distribution data using well-known computer-reconstruction techniques, such as filtered-back projection. In order to obtain an image depicting only the flowing nuclei in vessel 102 within slice 104, spatial distribution data for stationary nuclei (i.e., those in slice 104 outside vessel 102) is not displayed. It will be recognized that signal averaging may also be advantageously employed to improve the signal-to-noise ratio.

A disadvantage associated with the multiple angle projection reconstruction technique depicted in FIG. 4 is that the NMR signals must be observed in the presence of gradients so as to obtain useful information of the spatial distribution of nuclear spins. In order to do this, information must be gathered immediately at the end of the rephasing $G_z$ gradient pulse applied in intervals 5 and 12 in FIG. 4. However, it will be observed that the application of the readout $G_x$ and $G_y$ magnetic field gradients (intervals 6 and 13) presents a problem. Even if the readout gradients were applied abruptly, there will be a finite time when the exact resulting gradient is transient. Thus, during this period, spatial information is badly distorted, and the NMR signal cannot normally be used. The manner in which this shortcoming may be overcome is discussed with reference to FIGS. 5 and 6 and involves the creation of spin-echo signals either by the application of selective 180° RF pulses or dephasing and rephasing magnetic field gradients. Although FIGS. 5 and 6 depict various embodiments of the spin-warp imaging sequence, the techniques employed therein for the purpose of generating spin echoes are equally applicable to the multiple angle projection reconstruction method described with reference to FIG. 4.

Figure 5:
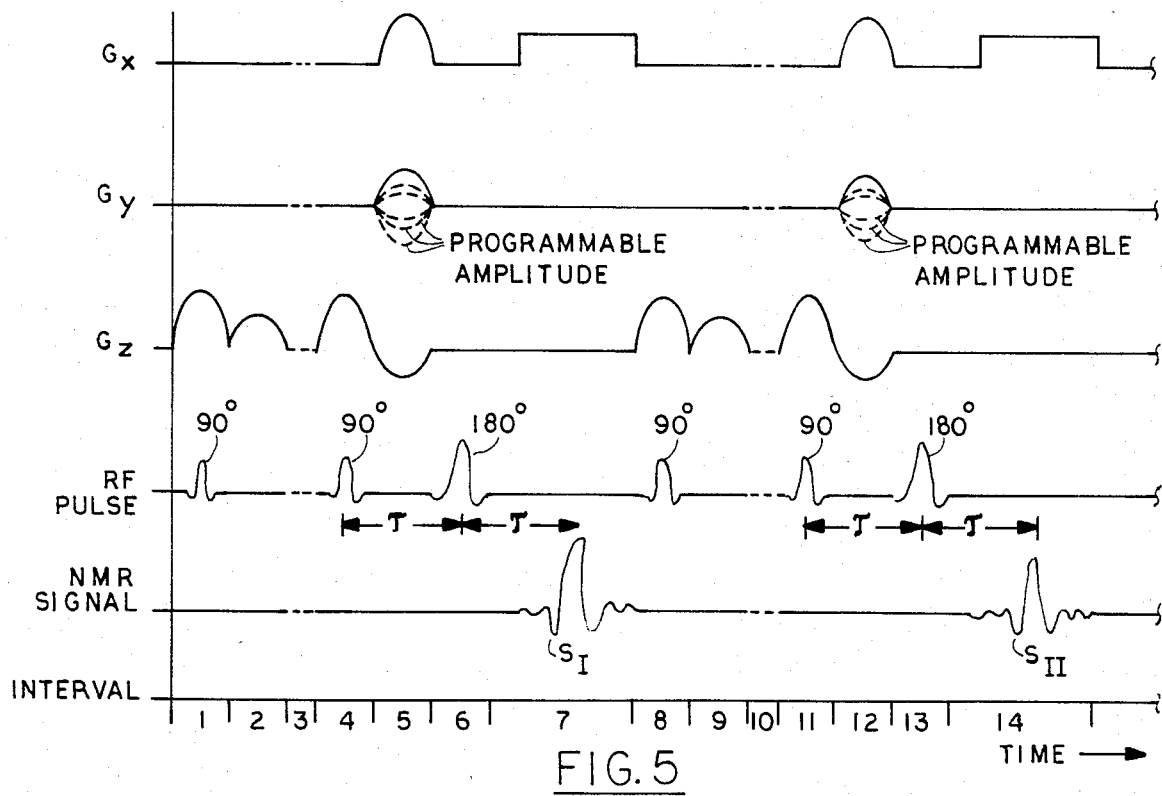
FIG. 5 is another embodiment of a detailed NMR pulse sequence utilized in accordance with the invention to measure blood-flow direction and velocity using the spin-warp imaging method.
Figure 6:
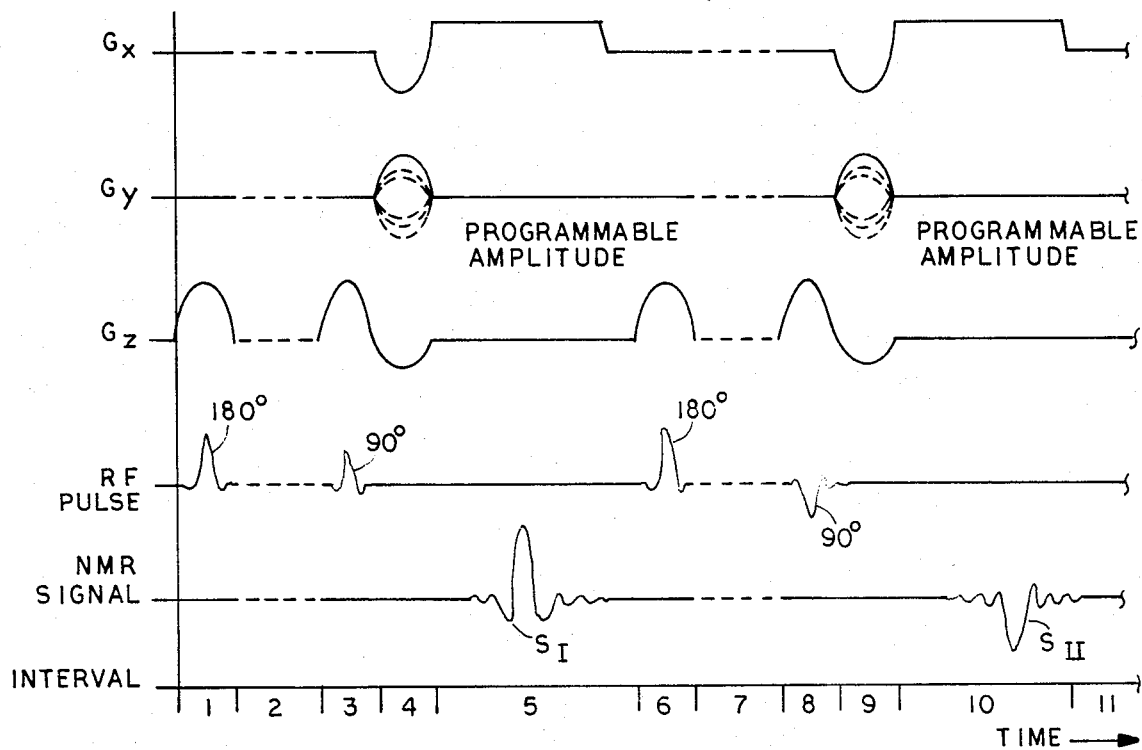
FIG. 6 is similar to FIG. 5 and depicts as yet another embodiment of the inventive NMR pulse sequence utilizing the spin-warp imaging method.

In the preferred embodiment, the invention, which is described in general terms with reference to FIG. 2, is practiced with the pulse sequence depicted in FIG. 5 and which is known as spin-warp imaging. Spin-warp imaging is a special case of the two-dimensional Fourier transform (2DFT) phase-encoding method of NMR imaging. This pulse sequence differs from that described with reference to FIG. 4 in the manner in which spatial information is encoded into the NMR signal and in the time in which the NMR signal is observed. The differences may be ascertained by observing that, in interval 5 of FIG. 5, a phase-encoding $G_y$ gradient is applied simultaneously with the application of a pulsed $G_x$ gradient. The $G_y$ gradient has a single peak amplitude in each application of the entire pulse sequence comprising intervals 1 through 13 of FIG. 5. However, in each successive application, a different amplitude (as implied by the dashed lines indicated in intervals 5 and 12) of the $G_y$ phase-encoding gradient is selected. The $G_y$ gradient encodes spatial information in the Y-axis direction by introducing a twist in the orientation of the transverse magnetization by a multiple of $2\pi$ over the total length of sample 100 in the Y-axis direction. Following the application of the first phase-encoding gradient, the transverse magnetization is twisted into a one-turn helix. Each different amplitude of the gradient $G_y$ introduces a different degree of twist (phase encoding). The number of $G_y$ gradient amplitudes is chosen to be equal to the number of pixels (typically 128 or 256) the reconstructed image will have in the Y-axis direction. In practice, the signals are averaged several times prior to advancing the $G_y$ gradient in order to improve the signal-to-noise ratio.

The effect of the $G_x$ gradient in interval 5 is to dephase the nuclear spins by a predetermined amount such that, when a 180° RF pulse is applied in interval 6, a spin-echo signal $S_I$ will be obtained in interval 7. The spin-echo signal will occur at a time $\tau$ following the mean application of the 180° RF pulse which is equal to the time $\tau$ between the mean application of the 90° RF pulse in interval 4, provided the time integral of the waveform of gradient $G_x$ over interval 5 is selected to be equal to the time integral of the waveform of gradient $G_x$ over interval 7. Spatial information is encoded in the X-axis direction by the application of linear $G_x$ gradient in interval 7 causing the nuclear spins to resonate at frequencies characteristic of their locations with respect to the X-axis. The $S_I$ signal is sampled in interval 7 a number of times which is equal to the number of pixels (typically 128 or 256) the reconstructed image will have in the X-axis direction. The image pixel values are obtained from the sampled signals using a two-dimensional Fourier transform, as disclosed, for example, by Kumar et al in *J. Mag. Res.* Vol. 18, p. 69 (1975).

In a similar fashion, spatial information is encoded into the $S_{II}$ spin-echo signal in interval 14 of FIG. 5 by the application of a programmable amplitude $G_y$ phase-encoding gradients in interval 12. A $G_x$ pulsed gradient is also applied in intervals 12 and 14 and is again selected to have equal time integrals of the waveform of the $G_x$ gradient over intervals 12 and 14.

It should also be noted that 180° RF pulses used to create spin echoes may also be advantageously employed with the pulse sequence described with reference to FIG. 4. In this case, the 180° RF pulses would be applied immediately following the application of the rephasing $G_z$ gradients in interval 5 and interval 12 of FIG. 4. In practice, it is difficult to realize perfect 180° RF pulses, so that frequently an undesired transverse magnetization component is induced and may produce a spurious NMR signal. For this reason, it is desirable to precede and follow the 180° RF pulses with large but equal magnitude gradients to rapidly destroy the transverse magnetization and shorten the spurious NMR signal. The gradients should be directed in the direction in which most of the sample is disposed. The use of gradients to reduce the effects of imperfect RF pulses is disclosed and claimed in application Ser. No. 394,355, filed July 1, 1982, and which is assigned to the same assignee as the present invention.

FIG. 6 depicts another embodiment of the spin-warp imaging sequence already described with reference to FIG. 5, but which also includes several alternatives which are useful with the pulse sequences depicted in both FIGS. 4 and 5. For example, in interval 1 of FIG. 6, a $G_z$ gradient pulse is applied simultaneously with a selective 180° RF pulse so as to invert the longitudinal magnetization in slice 104 of FIG. 1A. Similarly, a $G_z$ gradient is applied in interval 6 of FIG. 6 simultaneously with another selective 180° RF pulse to invert the magnetization in slice 106 of FIG. 1A. The effect of the selective 180° RF pulses is to invert the magnetization from the positive Z-axis direction to the negative Z-axis direction, such that no transverse magnetization component is created. In this regard, the use of the 180° RF pulses has the same effect as the use of the $G_z$ gradients in conjunction with the selective 90° pulses to saturate the nuclear spins as described with reference to FIGS. 2, 4, and 5.

Another modification which is depicted in FIG. 6 and which is applicable to the pulse sequences of both FIGS. 4 and 5 is the phase reversal of the 90° detection RF pulses applied in intervals 3 and 8 of FIG. 6. It will be observed that the spin-echo signal in interval 10 of FIG. 6 is phase inverted relative to the spin-echo signal in interval 5, due to the fact that a phase-inverted 90° RF pulse was employed in interval 8. The advantage of this method, as described hereinbefore, is that the difference between the $S_I$ and $S_{II}$ signals may be obtained by simply adding the spin-echo signals.

A further modification which is applicable to the pulse sequences of FIGS. 4 and 5 is that, in FIG. 6, gradients are used to produce spin-echo signals. Thus, gradient $G_x$ in intervals 4 and 9 has a negative lobe which reverses polarity to a linear positive gradient in intervals 5 and 10 during which the spin-echo signals are observed. In order that the spin-echo signals be properly timed within intervals 5 and 10, the time integrals of the waveforms of $G_x$ gradient in intervals 4 and 9 must be equal to the time integrals of the waveforms of the $G_x$ gradient in intervals 5 and 10, respectively. The equality of the integrals is a necessary condition in order that the spins dephased during intervals 4 and 9 be rephased by an equal amount in intervals 5 and 10 to produce the spin-echo signal.

It should be noted that the use of selective 180° inversion pulses in intervals 1 and 6 of FIG. 6 receives a longer waiting period following the interval 10 in order to ensure that in the successive application of the pulse sequence the magnetization in the detection slice is fully recovered. The use of such selective inverting pulses may, therefore, be less efficient than the saturation recovery techniques (90° RF excitation pulse-dephasing $G_Z$ gradient-recovery interval $-90°$ RF detection pulse) described hereinbefore with reference to FIGS. 2, 4, and 5. Moreover, the 180° selective pulses are more difficult to implement than the selective 90° RF pulses.

From the foregoing, it will be appreciated that, in accordance with the invention, a method is provided to detect and measure the direction and velocity of blood flow. The method is useful in making measurements of flowing blood in transaxial NMR images for which data may be collected by a varity of NMR imaging techniques. The method may also be used to measure the $T_1$ relaxation time of flowing nuclei.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A non-invasive method employing NMR for measuring direction and magnitude of nuclear spin flow velocity within a vessel in an NMR sample, comprising sequentially the steps of:
   (a) positioning said NMR sample in a substantially homogeneous magnetic field;
   (b) tagging a plurality of nuclear spins in a slice of said sample, including nuclear spins in a portion of said vessel situated in said slice;
   (c) exciting a plurality of nuclear spins in said slice to produce a first NMR signal originating substantially from said tagged nuclear spins situated in said slice and from untagged nuclear spins flowing in said vessel into said slice to replace at least some of the tagged nuclear spins flowing out of said slice;
   (d) tagging a plurality of nuclear spins in a region of said sample which includes at least a part of said vessel, said region also including said slice and extending therefrom in a direction opposite to the direction of flow;
   (e) exciting nuclear spins in said slice to produce a second NMR signal originating substantially from tagged nuclear spins situated in said slice and from tagged nuclear spins flowing in said vessel from said region into said slice; and
   (f) utilizing said first and second NMR signals to determine the magnitude of nuclear spin flow velocity in said vessel through said slice.

2. The method of claim 1 wherein said steps (b) and (d) of tagging each comprise the step of saturating the nuclear spins in said imaging slice and in said region.

3. The method of claim 2 wherein said step of saturating comprises the steps of:
   applying a magnetic field gradient;
   irradiating said sample with a magnetic field oscillating at the Larmor frequency in the presence of said magnetic field gradient so as to produce a net transverse magnetization in each of said slice and said region; and
   reapplying said magnetic field gradient to destroy said net transverse magnetization.

4. The method of claim 1 wherein said steps (c) and (e) of exciting each comprises the step of irradiating said NMR sample in the presence of a magnetic field gradient with a magnetic field oscillating at the Larmor frequency so as to preferentially excite the nuclear spins in said slice.

5. The method of claim 4 wherein said magnetic field oscillating at the Larmor frequency comprises a selective 90° RF pulse.

6. The method of claim 5 wherein said steps (c) and (e) of exciting comprises, rspectively, irradiating said NMR sample with selective 90° RF pulses which are 180° out of phase relative to one another, such that said first and second NMR signals are also out of phase with one another by 180°.

7. The method of claim 1 wherein said steps (b) and (d) each comprises the step of irradiating said sample in the presence of a magnetic field gradient with a selective 180° RF pulse at the Larmor frequency so as to preferentially invert the net longitudinal magnetization in each of said slice and said region.

8. The method of claim 1 wherein said slice is selected to be substantially perpendicular to the direction of nuclear spin flow in said vessel.

9. The method of claim 1 wherein said step of utilizing comprises the step of obtaining the difference, S, between said first and second NMR signals and determining nuclear spin velocity using the relation $$S = \rho 90 \, (d^2/4) \, vt e^{-t/T_1}$$

where:
   $\rho$ is nuclear spin density
   d is the vessel diameter
   v is nuclear spin flow velocity
   t is time interval between said steps (b) and (c) of tagging and exciting, which is equal to the interval between said steps (d) and (e) of tagging and exciting
   $T_1$ is the spin-lattice relaxation tiime of nuclear spins flowing in said vessel.

10. The method of claim 1 wherein said step of utilizing comprises forming the ratio of said first and second NMR signals and determining nuclear spin velocity using the relation:

$$S_I/S_{II} = \frac{l(1 - e^{-t/T_1}) + vt\, e^{-t/T_1}}{l(1 - e^{-t/T_1})}$$

where:

$S_I$ is said first NMR signal
$S_{II}$ is said second NMR signal
l is the width of said slice
v is nuclear spin flow velocity
$T_1$ is the spin-relaxation time of nuclear spins flowing in in said vessel
t is the time interval between said steps (b) and (c) of tagging and exciting, which is equal to the interval between said steps (d) and (e) of tagging and exciting.

11. The method of claim 1 further comprising the step of repeating the sequence of steps (b)–(f) at least once.

12. The method of claim 11 including the step of repeating the sequence of steps (b)–(f) at least once with a different time interval between said steps of (b) and (c) tagging and exciting, which is equal to the interval between said steps (d) and (e) of tagging and exciting.

13. The method of claim 12 further comprising the step of determining the spin-lattice relaxation time of said nuclear spins flowing in said vessel using the relation $$S/S' = \frac{t\, e^{-t/T_1}}{t'\, e^{-t'/T_1}}$$

where:

t is the time interval between said steps (b) and (c) of tagging and exciting, said interval t also being the interval between said steps (d) and (e) of tagging and exciting in one sequence of steps (b)–(f)
t' is the time interval between said steps of tagging and exciting, said time interval t' also being the interval between said steps (d) and (e) of tagging and exciting in another sequence of steps (b)–(f)
S is the difference between said first and second NMR signals in the sequence using interval t
S' is the difference between said first and second NMR signals in the sequence using interval t'
$T_1$ is the spin-lattice relaxation time of nuclear spins flowing in said vessel.

14. An NMR method of imaging nuclear spin flow within a vessel of an NMR sample, comprising sequentially the steps of:
(a) positioning said NMR sample in a substantially homogeneous magnetic field;
(b) tagging a plurality of nuclear spins in a slice of said sample, including nuclear spins in a portion of said vessel situated in said slice;
(c) exciting a plurality of nuclear spins in said slice to produce a first NMR signal originating substantially from said tagged nuclear spins situated in said slice and from untagged nuclear spins flowing in said vessel into said slice to replace at least some of the tagged nuclear spins flowing out of said slice;
(d) tagging a plurality of nuclear spins in a region of said sample which includes at least a part of said vessel, said region also including said slice and extending therefrom in a direction opposite to the direction of flow;
(e) exciting nuclear spins in said slice to produce a second NMR signal originating substantially from tagged nuclear spins situated in said slice and from tagged nuclear spins flowing in said vessel from said region into said slice; and
(f) sampling each of said first and second NMR signals in the presence of at least one magnetic field gradient for encoding spatial information of nuclear spin distribution of stationary spins within said slice and including the distribution of nuclear spins flowing within the portion of said vessel contained in said slice; and
(g) constructing an image which depicts the nuclear spin distribution of spins flowing within said vessel, said image additionally depicting the relative position of said vessel in said slice.

15. The method of claim 14 wherein said steps (b) and (d) of tagging each comprises the step of irradiating said sample in the presence of a magnetic field gradient with a selective 180° RF pulse at the Larmor frequency so as to preferentially invert the net longitudinal magnetization in each of said slice and said region.

16. The method of claim 14 wherein said steps (b) and (d) of tagging each comprises the step of saturating the nuclear spins in said imaging slice and in said region.

17. The method of claim 16 wherein said step of saturating comprises the steps of:
applying a magnetic field gradient;
irradiating said sample with a magnetic field oscillating at the Larmor frequency in the presence of said last-mentioned magnetic field gradient so as to produce a net transverse magnetization in each of said slice and said region; and
reapplying said last-mentioned magnetic field gradient to destroy said net transverse magnetization.

18. The method of claim 14 wherein said steps (c) and (e) of exciting each comprises the step of irradiating said NMR sample in the presence of a magnetic field gradient with a magnetic field oscillating at the Larmor frequency so as to preferentially excite the nuclear spins in said slice.

19. The method of claim 18 wherein said magnetic field oscillating at the Larmor frequency comprises a selective 90° RF pulse.

20. The method of claim 19 wherein said steps (c) and (e) of exciting comprises, respectively, irradiating said NMR sample with selective 90° RF pulses which are 180° out of phase relative to one another, such that said first and second NMR signals are also out of phase with one another by 180°.

21. The method of claim 14 wherein said steps (b) and (d) of tagging each comprise the step of irradiating said sample in the presence of a magnetic field gradient with a selective 180° RF pulse at the Larmor frequency so as to invert the net longitudinal magnetization in each of said slice and said region.

22. The method of claim 14 further comprising the step of repeating said sequence of steps (b)–(f) at least once.

23. The method of claim 22 wherein said magnetic field gradient is selected to have one of a plurality of directions within said slice for each repetition of steps (b)–(f) and wherein said sequence of steps (b)–(f) is repeated at least once for each one of said plurality of directions.

24. The method of claim 23 wherein sid magnetic field gradient comprises a resultant magnetic field gradient of the vectorial addition of at least two magnetic field gradients, which gradients are perpendicular to one another within said slice.

25. The method of one of claims 14, 22, or 23 further comprising the step of forming a spin-echo signal of each of said first and second NMR signals and wherein said step of sampling comprises sampling said spin-echo signals.

26. The method of claim 25 wherein said step of forming a spin-echo signal comprises irradiating said slice following each of said steps exciting with an 180° RF pulse.

27. The method of claim 25 wherein said step of forming a spin-echo signal comprises applying at least one dephasing magnetic field gradient, following each of said steps of exciting, of one polarity to dephase said excited nuclear spins by a predetermined amount and then reversing the polarity of the dephasing magnetic field gradient so as to rephase said nuclear spins thereby to produce spin-echo signals corresponding to each of said first and second NMR signals.

28. The method of claim 22 further comprising the step of applying, following each of said steps of exciting, a variable amplitude magnetic field gradient having one of a plurality of programmable amplitudes to encode spatial information into said first and second NMR signals, and wherein said sequence of steps (b)–(f) is repeated at least once for each one of said plurality of programmable amplitudes.

29. The method of claim 28 wherein said first and second NMR signals are sampled in the presence of a substantially linear magnetic field gradient which gradient has a direction substantially perpendicular to the direction of said variable amplitude gradient within said slice.

30. The method of claim 28 or 29 further comprising the step of forming a spin-echo signal of each of said first and second NMR signals and wherein said step of sampling comprises sampling said spin-echo signals.

31. The method of claim 30 wherein said step of forming a spin-echo signal comprises irradiating said slice following the application of said variable amplitude magnetic field gradient with an 180° RF pulse.

32. The method of claim 30 wherein said step of forming a spin-echo signal comprises applying at least one dephasing magnetic field gradient simultaneously with the application of said variable amplitude gradient, but in a direction perpendicular thereto, of one polarity to dephase said excited nuclear spins by a predetermined amount and then reversing the polarity of the dephasing magnetic field so as to rephase said nuclear spins thereby to produce spin-echo signals corresponding to each of said first and second NMR signals.

* * * * *

UNITED STATES PATENT AND TRADEMARK OFFICE
CERTIFICATE OF CORRECTION

PATENT NO. : 4,532,473

DATED : July 30, 1985

INVENTOR(S) : Felix W. Wehrli

It is certified that error appears in the above-identified patent and that said Letters Patent is hereby corrected as shown below:

Col. 2, Line 39 change "there" to --three--;
Col. 4, line 66 change "neclei" to --nuclei--;
Col. 6, line 6, change "symmertrically" to --symmetrically--;
Col. 6, line 20, change "disadvangtage" to --disadvantage--;
Col. 6, line 22, change "neclei" to --nuclei--;

Col. 11, line 29 change "$G_7$" to --$G_z$--;
Col. 12, line 51, change "90" to -- $\pi$ --.

Signed and Sealed this

Twenty-fifth Day of February 1986

[SEAL]

Attest:

DONALD J. QUIGG

Attesting Officer     Commissioner of Patents and Trademarks